*(12)* United States Patent
Kamada

(10) Patent No.: US 8,985,830 B2
(45) Date of Patent: Mar. 24, 2015

(54) SWITCH, KEYBOARD INSTRUMENT PROVIDED WITH THE SAME, AND LIGHT EMISSION CONTROL CIRCUT

(71) Applicant: Kabushiki Kaisha Kawai Gakki Seisakusho, Hamamatsu, Shizuoka-ken (JP)

(72) Inventor: Kenji Kamada, Hamamatsu (JP)

(73) Assignee: Kabushiki Kaisha Kawai Gakki Seisakusho, Hamamatsu-shi, Shizuoka-ken (JP)

( * ) Notice: Subject to any disclaimer, the term of this patent is extended or adjusted under 35 U.S.C. 154(b) by 44 days.

(21) Appl. No.: 13/836,814

(22) Filed: Mar. 15, 2013

(65) Prior Publication Data

US 2013/0250613 A1   Sep. 26, 2013

(30) Foreign Application Priority Data

Mar. 26, 2012   (JP) ................................ 2012-069602
Mar. 26, 2012   (JP) ................................ 2012-069603

(51) Int. Cl.
*F21V 8/00*      (2006.01)
*H05B 37/02*    (2006.01)

(52) U.S. Cl.
CPC .......... *G02B 6/0018* (2013.01); *H05B 37/0227* (2013.01)
USPC ...................................................... 362/608

(58) Field of Classification Search
USPC .............. 362/23.03, 608, 602, 603, 604, 605, 362/23.04, 85; 315/185 R, 291, 312, 313, 315/209 R, 224, 324
See application file for complete search history.

(56) References Cited

U.S. PATENT DOCUMENTS

| | | | |
|---|---|---|---|
| 4,420,711 A * | 12/1983 | Takahashi et al. ............ 315/296 |
| 6,501,526 B1 | 12/2002 | Oh |
| 6,501,529 B1 | 12/2002 | Kurihara et al. |
| 7,705,543 B2 * | 4/2010 | Ragonesi et al. ......... 315/209 R |
| 8,432,102 B2 * | 4/2013 | Terlizzi et al. ............ 315/209 R |
| 8,466,814 B2 * | 6/2013 | Han ................................. 341/33 |
| 2001/0020578 A1 | 9/2001 | Baier |
| 2003/0210537 A1* | 11/2003 | Engelmann ..................... 362/26 |
| 2007/0210163 A1* | 9/2007 | Han ......................... 235/462.01 |
| 2008/0122661 A1* | 5/2008 | Han ................................. 341/22 |
| 2012/0146926 A1* | 6/2012 | An et al. ........................ 345/173 |
| 2013/0147380 A1* | 6/2013 | Chobot ......................... 315/210 |

FOREIGN PATENT DOCUMENTS

JP         80 218 42 B1   3/1996
JP       2001 075 074 A1   3/2001
(Continued)

OTHER PUBLICATIONS

Antonio Munoz et al., "One Microcontroller Pin Drives Two LEDs With Low Quiescent Current" www.edn.com, Feb. 7, 2008.

*Primary Examiner* — Bao Q Truong
(74) *Attorney, Agent, or Firm* — Davis & Bujold PLLC; Michael J. Bujold

(57) ABSTRACT

A switch according to the present invention includes: a substrate; a touch sensor; a light guide plate; a light emitting unit; and a control unit. The light guide plate has a surrounding side surface chamfered so that a light entering into the surrounding side surface of the light guide plate diffusely reflects inside the light guide plate. The light emitting unit is arranged at a position facing the surrounding side surface of the light guide plate. The light emitting unit is configured to emit the light to the surrounding side surface of the light guide plate.

14 Claims, 6 Drawing Sheets

(56) References Cited

FOREIGN PATENT DOCUMENTS

| | | |
|---|---|---|
| JP | 2001 318 366 A1 | 11/2001 |
| JP | 2004 071 233 A1 | 3/2004 |
| JP | 2004 152 609 A1 | 5/2004 |
| JP | 2004 164 893 A1 | 6/2004 |
| JP | 2004 241 358 A1 | 8/2004 |
| JP | 2007 234 584 A1 | 9/2007 |
| JP | 2011 070 865 A1 | 4/2011 |
| JP | 2011 138 694 A1 | 7/2011 |

* cited by examiner

RELATED ART

SWITCH, KEYBOARD INSTRUMENT PROVIDED WITH THE SAME, AND LIGHT EMISSION CONTROL CIRCUT

CROSS-REFERENCE TO RELATED APPLICATIONS

This application claims the benefit of Japanese Patent Applications No. 2012-069602 and 2012-069603, filed on Mar. 26, 2012 in the Japan Patent Office, the disclosures of which are incorporated herein by reference.

BACKGROUND

The present invention relates to a light emitting technology for a switch.

Japanese Unexamined Patent Application Publication No. 2007-234584 discloses therein a switch operable by an operator's touch operation. The switch is provided with a touch sensor detecting the touch operation, a light guide plate accumulated on the touch sensor, and a pair of LEDs that emits lights for backlighting at the side surfaces of the light guide plate.

According to this switch, the operator can recognize the presence of the switch operation by turning on the pair of LEDs such as when the switch is operated. In order to indicate a type of the switch and so on, some pattern representing the type of the switch, such as a letter, figure, symbol, can be carved on a bottom surface of the light guide plate. When such light guide plate is exposed to the light emitted by the LED, the light diffusively reflects at the carved portion serving as the pattern. The diffusive reflection enables the carved portion to illuminate more strongly than its surroundings and the operator sees the pattern illuminating. As illustrated in FIG. 6, in order to turn on the pair of LEDs individually, the control elements are provided for the respective LEDs.

According to the switch configured as described above, the LED lights are thrown at the side surfaces of the light guide plate, so that the light intensities are not exhibited evenly at areas close to the LEDs, and at areas away therefrom, of the carved portion.

Further, since the control elements are provided for the respective LEDs, the size of the light emission control circuit is likely to be large in order to allow the switch to emit light. It is thus necessary to improve light emitting efficiency in view of the above.

SUMMARY

It is preferable that one aspect of the present invention can improve the light emitting efficiency for a switch.

A switch according to one aspect of the present invention includes a substrate, a touch sensor, a light guide plate, a light emitting unit, and a control unit. The touch sensor is mounted on the substrate and is configured to detect an operator's touch operation relative to the switch. The light guide plate is stacked on the touch sensor and has a surrounding side surface chamfered such that a light entering into the surrounding side surface of the light guide plate diffusely reflects inside the light guide plate. The light emitting unit is mounted on the substrate and arranged at a position facing the surrounding side surface of the light guide plate. The light emitting unit is configured to emit the light to the surrounding side surface of the light guide plate. The control unit is configured to control a light emission of the light emitting unit in accordance with a detection result of the touch sensor for detecting the operator's touch operation.

In the switch configured as described above, when the light emitting unit emits the light to the light guide plate, the light emitted by the light emitting unit is introduced into the light guide plate while scattering at the chamfered surrounding side surface of the light guide plate. The introduced light then spreads throughout the light guide plate. The spread light repeatedly reflects and scatters by shining on the surrounding side surface of the light guide plate therein.

Accordingly, the switch can illuminate evenly overall, thereby improving the light emitting efficiency.

The surrounding side surface of the light guide plate may be chamfered linearly and into a slant so that an edge of a first surface of the light guide plate is located inside of an edge of a second surface of the light guide plate opposite to the first surface and the first surface and second surface of the light guide plate are arranged coaxially.

In this case, by exposing the light guide plate to the light emitted by the light emitting unit, the chamfered portion illuminates, thereby enabling to display accurately an area functioning as the switch, like an icon.

The light guide plate may include a carved portion formed by carving a part of the light guide plate to form a pattern.

In this case, it is possible to let the distinctive pattern carved to appear clearly on the switch by turning on the switch.

The switch can further include a translucent plate located at a position facing a surface of the light guide plate in coplanar with a surface of a casing provided with the switch.

A sheet may be layered at a side of the translucent plate facing the light guide plate and cover a portion excluding a portion facing the light guide plate.

In this case, the light emitted by the light emitting unit does not leak outwardly through the translucent plate. Accordingly, when the light emitting unit turns on, it is possible to display the pattern clearly on the translucent plate without the interruption by the direct light from the light emitting unit.

The touch sensor may be a sensor configured to perform a first detection and a second detection. The first detection serves to detect an operator's hand placed over the touch sensor at a predetermined distant position from the touch sensor where the operator does not touch the translucent plate. The second detection serves to detect the operator's touch on the translucent plate. The control unit may be configured to allow the light emitting unit to perform a first light emission when the touch sensor performs the first detection and to allow the light emitting unit to perform a second light emission when the touch sensor performs the second detection.

In the switch configured as described above, when the translucent plate is presented in the same color as the casing, the switch is less noticeable on the casing until the operator's hand approaches the switch. Once the operator's hand is close to the switch, the first light emission is performed, thereby enabling to exhibit clearly the position of the switch to the operator. Further, when the operator touches the switch, the second light emission is performed, thereby enabling to exhibit clearly that the switch has been operated.

The first and second light emissions are employed to have the operator recognize the difference in light emitting. For example, the light emitting unit may be configured to emit lights having a plurality of different colors. The control unit may be configured to control the light emitting unit to emit the light having any one of the plurality of different colors in accordance with the detection result of the touch sensor.

The light emitted by the first light emission may have not only a color but also a brightness being different from the ones of the light emitted by the second light emission. Further, the first light emission may emit the light in a different way from the second light emission, such as blinking, continuous lighting, brightness, and a combination thereof.

The control unit may be configured to stop the light emission of the light emitting unit when a predetermined period of time has elapsed since the touch sensor does not detect the touch operation. In this case, it is possible to reduce the amount of power consumption.

The light emitting unit may include a first light source and a second light source connected in series each other between a predetermined voltage applied point and a predetermined ground point. The switch may further include a voltage applying unit configured to apply a driving voltage enabling one of the first light source and the second light source to turn on between the voltage applied point and the ground point; and a control element having an output terminal connected between the first light source and the second light source, connected to the control unit, and configured to be driven by the driving voltage. The control unit may be configured to control the control element, and the control element may be configured to switch a voltage of the output terminal among the driving voltage, a ground voltage being a voltage at the ground point, and a voltage lower than the driving voltage and higher than the ground voltage.

In this case, it is possible to control the light emissions both of the first and second light sources with the single control element. It is therefore possible to downsize the switch and hence to improve the light emitting efficiency of the switch.

The above-described switch may be employed for a keyboard instrument, especially as a switch on a touch panel portion of the keyboard instrument, the touch panel having a plurality of such switches.

A light emission control circuit according to another aspect of the present invention includes a first light source, a second light source, a voltage applying unit, a control element, and a control unit. The first light source and the second light source are connected in series each other between a predetermined voltage applied point and a predetermined ground point. The voltage applying unit is configured to apply a driving voltage enabling one of the first light source and the second light source to turn on between the voltage applied point and the ground point. The control element has an output terminal connected between the first light source and the second light source and is configured to operate by the driving voltage. The control unit is configured to control the control element. The control element is configured to switch a voltage of the output terminal among the driving voltage, a ground voltage being a voltage at the ground point, and a voltage lower than the driving voltage and higher than the ground voltage.

In the above described light emission control circuit, it is possible to control the light emissions both by the first light source and the second light source independently by the single control element, thereby enabling to downsize the light emission control circuit. Accordingly, the light emission efficiency of the switch is improved.

The first light source and the second light source may be connected to adjusting resistors that adjust voltages applied to the first light source and the second light source.

In this case, replacing the resistors is able to adjust the voltages applied to the first light source and the second light source to voltages appropriate to control turning on of the first light source and the second light source by the single control element.

Any element may be employed as the control element, for example a three-state buffer.

The first light source may be configured to emit a light having a color different from a color of a light emitted by the second light source.

In this case, it is possible for the single control element to control emitting of the lights having a plurality of colors

BRIEF DESCRIPTION OF THE DRAWINGS

The invention will now be described below, by way of example, with reference to the accompanying drawings, in which:

FIGS. 3A and 3B are views illustrating a configuration of a switch of the embodiment in which FIG. 3A is a plan view of the keyboard frame, an enlarged view enlarging an area surrounded with a reference mark "P" in FIG. 2, and a transparent view illustrating a light guide plate and LEDs of the switch; and FIG. 3B is a cross sectional view taken along a line IIIB-IIIB in FIG. 3A.

DETAILED DESCRIPTION OF THE PREFERRED EMBODIMENTS

In a keyboard instrument of the embodiment of the present embodiment, a side of a player of the keyboard instrument is recognized to as the forward side. Hereinafter, the side of the player is referred to as the forward side or a front side.

[Overall Structure]

Figure 1:
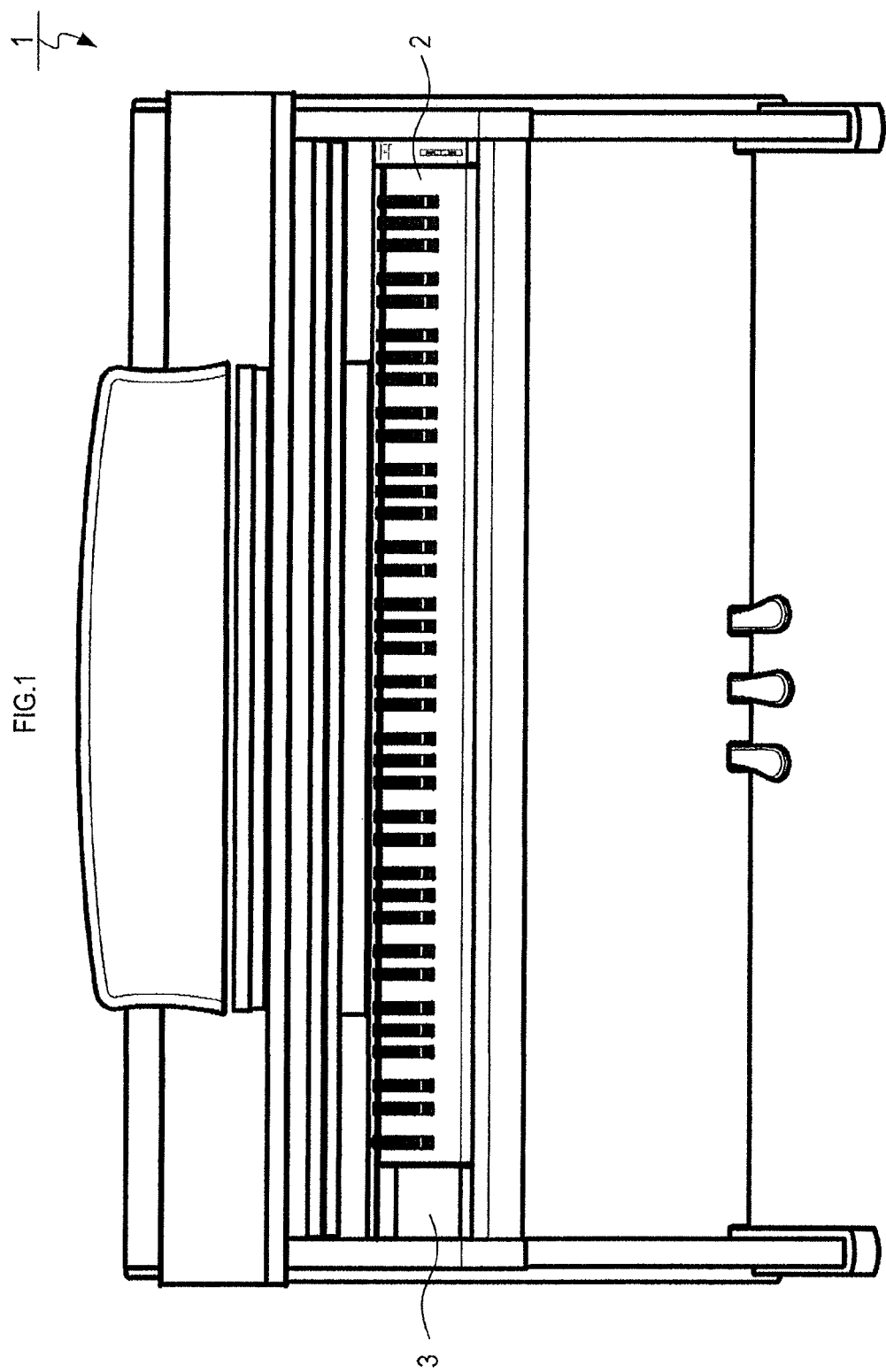
FIG. 1 is a front view illustrating a keyboard instrument of an embodiment of the present invention.

As illustrated in FIG. 1, the keyboard instrument 1 of the embodiment is an electronic piano provided with a keyboard 2 having a plurality of keys (for example, eighty eight (88) keys). A keyboard frame 3, which is arranged at a left side of the keyboard 2, is used as an operation panel to operate the keyboard instrument 1.

This key board frame 3 is provided with a plurality of switches 30 (see FIG. 2), a surface of each of the switches 30 being colored in the same color as a surface of the keyboard frame 3 and provided coplanar with the surface of the keyboard frame 3. In the keyboard instrument 1 of the embodiment, each of the switches 30 is thus configured in a manner that each of the switches 30 does not stand out visually in the keyboard frame 3 at its non-operated state.

[Switch Structure]

Figure 2:
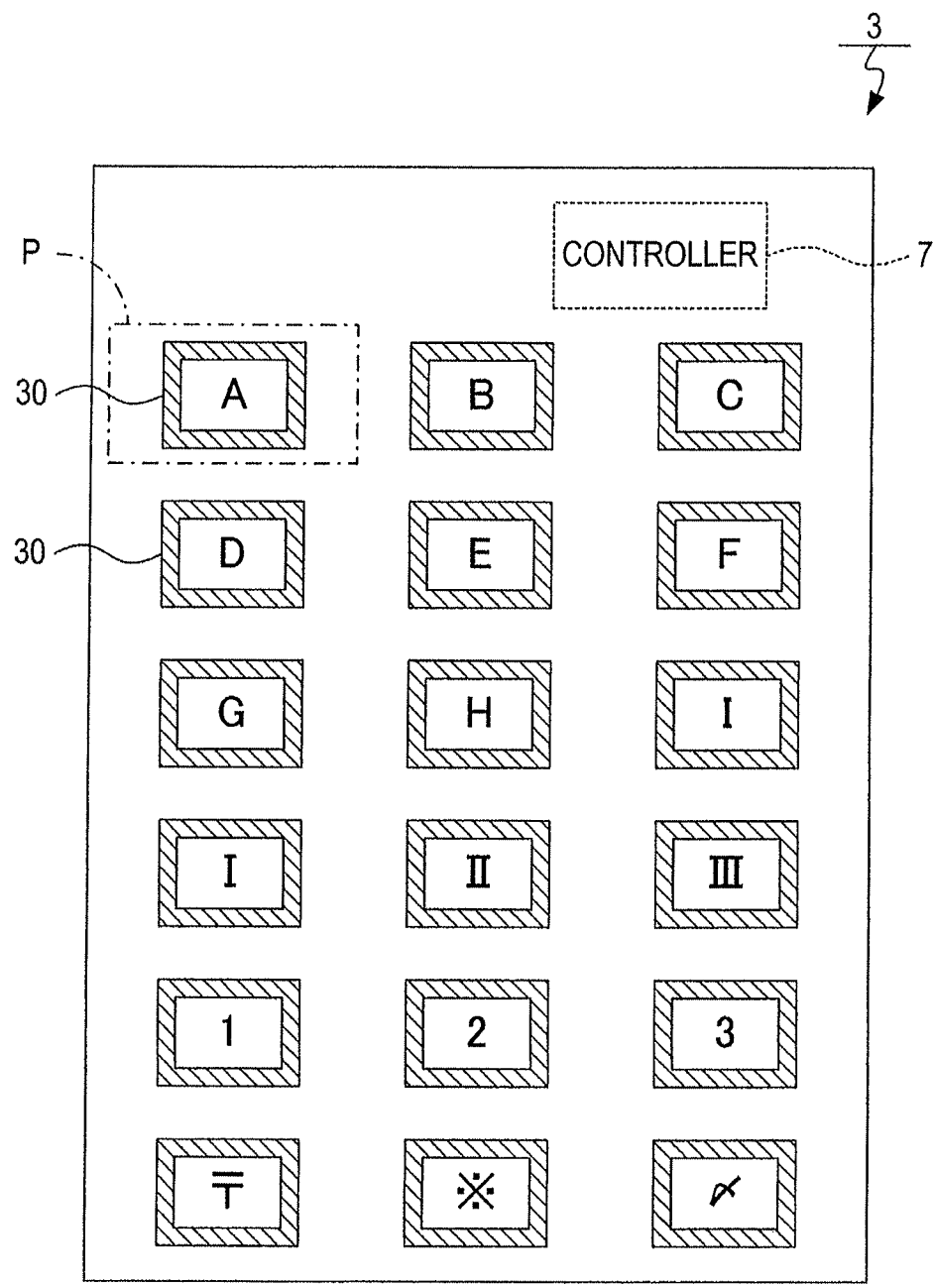
FIG. 2 is a plan view illustrating a keyboard frame of the embodiment.

As illustrated in FIG. 2, each of the switches 30 provided in the keyboard frame 3 of the embodiment includes a pattern, such as a number or symbol, and a frame surrounding the pattern. Each of the switches 30 is configured to light up the frame in response to an operation to the switch 30.

A controller 7 is provided at a backside of the keyboard frame 3, which controls the keyboard frame 3 serving as an operational panel in response to the operations of the respective switches 30.

Figure 3A:
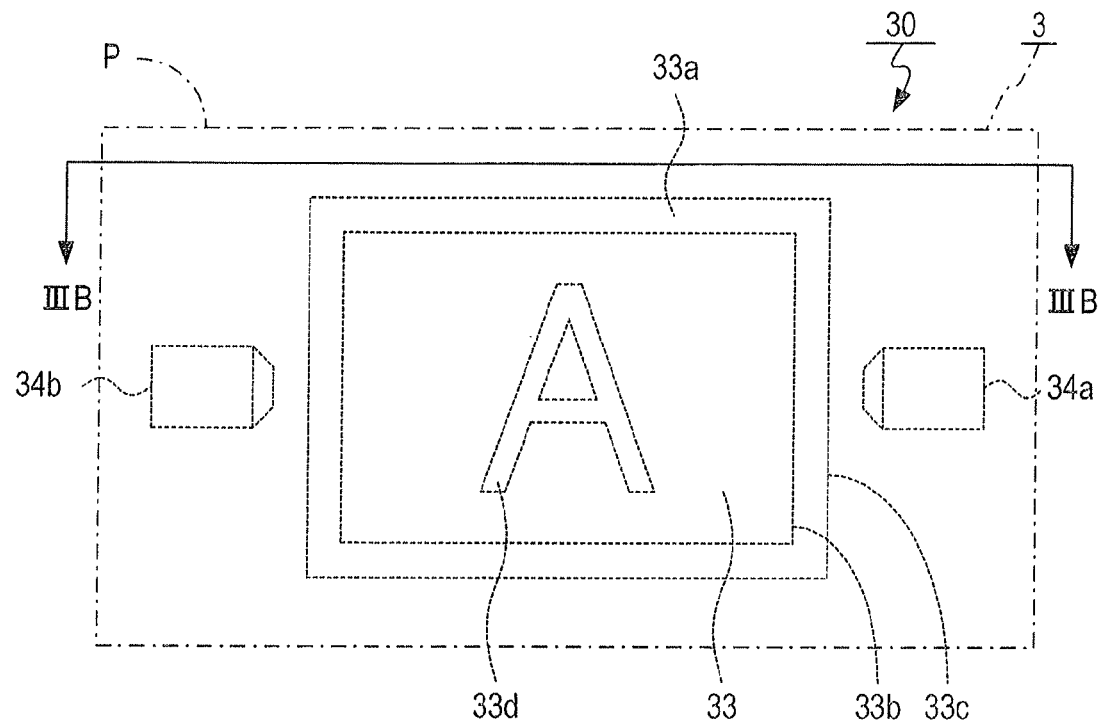
Figure 3B:
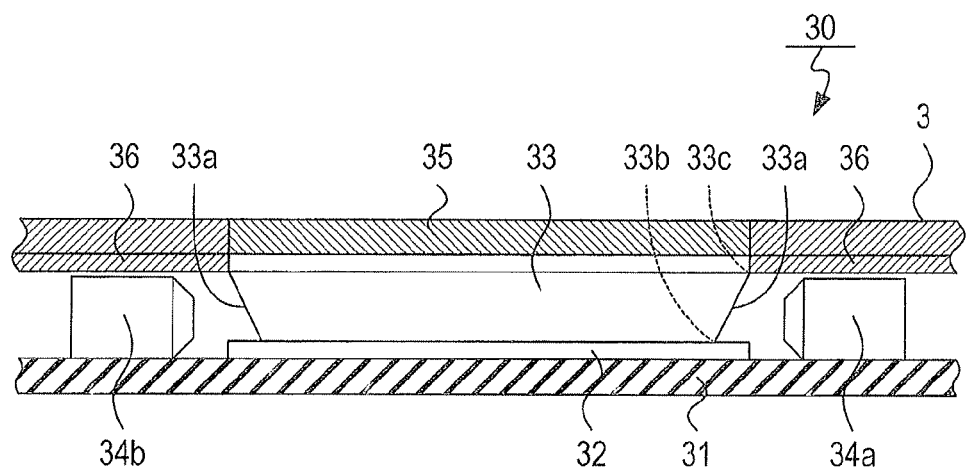

As illustrated in FIGS. 3A and 3B, the switch 30 includes a substrate 31, a touch sensor 32 that is mounted on the substrate 31 and detects an operator's touch operation, and a light guide plate 33 stacked on the touch sensor 32.

The switch 30 is provided with a pair of LEDs 34a, 34b mounted on the substrate 31. The pair of LEDs 34a, 34b are located at places facing each other via the light guide plate 33. Specifically, in FIGS. 3A and 3B, the LED 34a is positioned at the right side of the light guide plate 33, while the LED 34b is positioned at the left side thereof. The switch 30 is further provided with a smoked acrylic 35 colored in the same color as the keyboard frame 3 and a sheet 36 serving to shield lights emitted from the pair of LEDs 34a 34b. The smoked acrylic 35 is located at a position facing a top surface of the light guide plate 33 and being coplanar with the surface of the keyboard frame 3.

A sheet 36 is layered at the back side of the keyboard frame 3 excluding a portion of the keyboard frame 3 facing the top surface of the light guide plate 33. The sheet 36 inhibits the lights emitted from the LED 34a and 34b from passing directly and outwardly through the smoked acrylic 35.

The light guide plate 33 is formed so that a planar shape of the top surface of the light guide plate 33 and a planar shape of a bottom surface of the light guide plate 33 are of rectangular shape similar to each other. More specifically, as illustrated in FIGS. 3A and 3B, the light guide plate 33 has a chamfered surrounding side surface 33a cut linearly but into a slant so that an edge 33b of the bottom surface of the light guide plate 33 is located inside of an edge 33c of the top surface of the light guide plate 33 with the center of the top surface overlapping the center of the bottom surface. In this configuration, the top and bottom surfaces of the light guide plate 33 are arranged coaxially. A carved portion 33d is formed at the bottom surface of the light guide plate 33, which is carved into the pattern allocated to each of the switches 30. In FIG. 3A, the carved portion 33d is shaped into an alphabet in capital letter "A".

The LED 34a is embodied by an LED adapted to emit a yellow light, and the LED 34b is embodied by an LED adapted to emit a red light. As the touch sensor 32, some sensor can be employed which is able to perform both a first detection and a second detection (for example, "QTouch" manufactured by Atmel Corporation). The first detection refers to a detection of an operator's hand placed over the touch sensor 32 at a predetermined distant position from the touch sensor 32 where the operator does not touch the smoked acrylic 35. According to the embodiment, the predetermined distant position denotes somewhere two centimeters above the surface of the keyboard frame 3. The second detection refers to a detection of the operator's touch on the smoked acrylic 35, thereby transmitting the touch pressure to the touch sensor 32 via the light guide plate 33.

According to the switch 30 configured as described above, when the touch sensor 32 performs the first detection or the second detection and either the LED 34a or 34b then turns on, the light emitted by the LED 34a or 34b is introduced into the light guide plate 33 while scattering at the slanted surrounding side surface 33a of the light guide plate 33. The introduced light then spreads throughout the light guide plate 33. The spread light repeatedly reflects and scatters by shining on the surrounding side surface 33a of the light guide plate 33 therein. The light is hence evenly distributed across the carved portion 33d of the light guide plate 33, resulting in the diffuse reflection of the light at the carved portion 33d.

Therefore, regarding the switch 30 of the embodiment, the turning on of the LED 34a or 34b enables an area having the carved portion 33d to illuminate more brightly than its surrounding and the corresponding pattern for the switch 30 ("A" in FIG. 3A) to illuminate evenly.

According to the embodiment, by exposing the slanted surrounding side surface 33a of the light guide plate 33 to the light emitted by the LED 34a or 34b, it is possible to indicate accurately, on the keyboard frame 3, an area functioning as the switch, like an icon.

[Light Emission Control Circuit]

Figure 4:
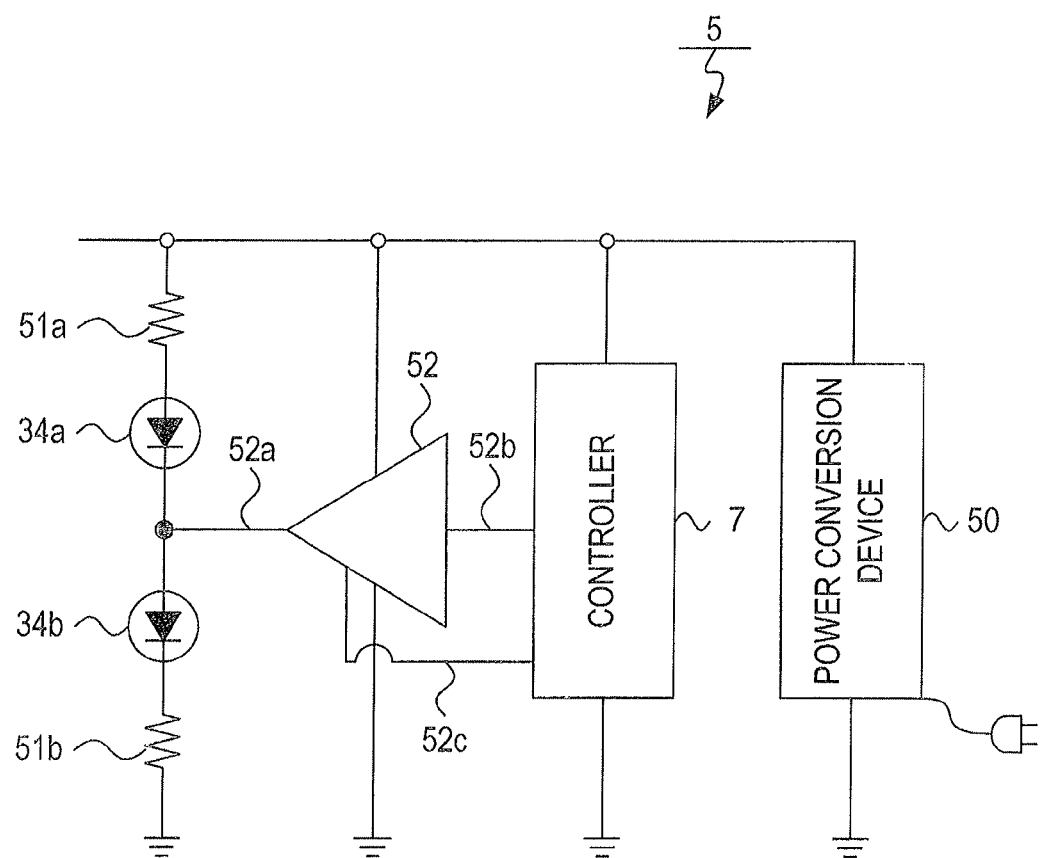
FIG. 4 is a circuit diagram of a light emission control circuit that controls light emission of each of the switches of the embodiment.

FIG. 4 illustrates a light emission control circuit 5 configured to control the turning on of each of the switches 30. As seen in FIG. 4, the light emission control circuit 5 is provided with a power conversion device 50 that converts an alternating-current power supplied from an external commercial power source of the keyboard instrument 1 into a predetermined direct-current power.

Here, a portion, which is applied with a positive voltage from the power conversion device 50 (i.e., a portion to be supplied with the power), is referred to as a voltage applied point, and a portion, which is connected to a ground of the light emission control circuit 5, is referred to as a ground point. The ground point serves to provide a reference potential of the light emission control circuit 5.

The light emission control circuit 5 is further provided with the aforementioned pair of LEDs 34a and 34b and the aforementioned adjusting resistors 51a, 51b individually for the respective switches 30. FIG. 4 shows the pair of LEDS 34a, 34b and the adjusting resistors 51a, 51b provided for only one of the switches 30. More specifically, one end of the adjusting resistor 51a is connected to the voltage applied point, and the other end thereof is connected to an anode of the LED 34a. A cathode of the LED 34a is connected to an anode of the LED 34b, and a cathode of the LED 34b is connected to the ground point via the adjusting resistor 51b.

The light emission control circuit 5 is still further provided with three-state buffers 52 individually for the respective switches 30, which are activated by receiving the power from the power conversion device 50. FIG. 4 shows the three-state buffer 52 provided for only one of the switches 30. As seen in FIG. 4, an output terminal 52a of the three-state buffer 52 is connected to a connecting point of the cathode of the LED 34a and the anode of the LED 34b, and a first input terminal 52b and a second input terminal 52c of the three-state buffer 52 are connected to the controller 7. The first input terminal 52b is inputted with an input signal having a logical value "High" or "Low", and the second input terminal 52c is inputted with a control signal having a logical value "High" or "Low" and controlling a state of the output terminal 52a to a high impedance state or not. The output terminal 52a outputs a voltage having the logical value "High" or "Low" or becomes the "high impedance" state in response to both the logical value of the input signal inputted to the first input terminal 52b and the logical value of the control signal inputted to the second input terminal 52c.

That is, the three-state buffer 52 is activated by the power supplied from the power conversion device 50. Accordingly, the three-state buffer 52 is able to adjust the voltage of the output terminal 52a between the voltage at the voltage applied point and the voltage at the ground point, in response to the logical value of the input signal inputted by the controller 7 via the first input terminal 52b. Further, the three-state buffer 52 is able to adjust the output terminal 52a to be at the high impedance state in response to the logical value of the control signal inputted by the controller 7 via the second input terminal 52c.

When the output terminal 52a becomes to the high impedance state, the voltage of the output terminal 52a becomes equal to a voltage at the connecting point between the cathode of the LED 34a and the anode of the LED 34b (connecting point voltage). The connecting point voltage is equal to a voltage obtained by subtracting an amount of voltage drops in the adjusting resistor 51a and the LED 34a from a voltage at the voltage applied point.

The light emission control circuit 5 of the embodiment is configured in a manner that the power conversion device 50 supplies a voltage enabling only one of the LEDs 34a and 34b connected as mentioned above to turn on.

[Light Emission Control]

In the light emission control circuit 5 configured as described above, the controller 7 performs the light emission control as described below.

The light emission control is initiated in response to turn-on of a power-supply switch (not illustrated) of the keyboard instrument 1 of the embodiment and is repetitively performed until the power-supply switch is turned off.

Figure 5:
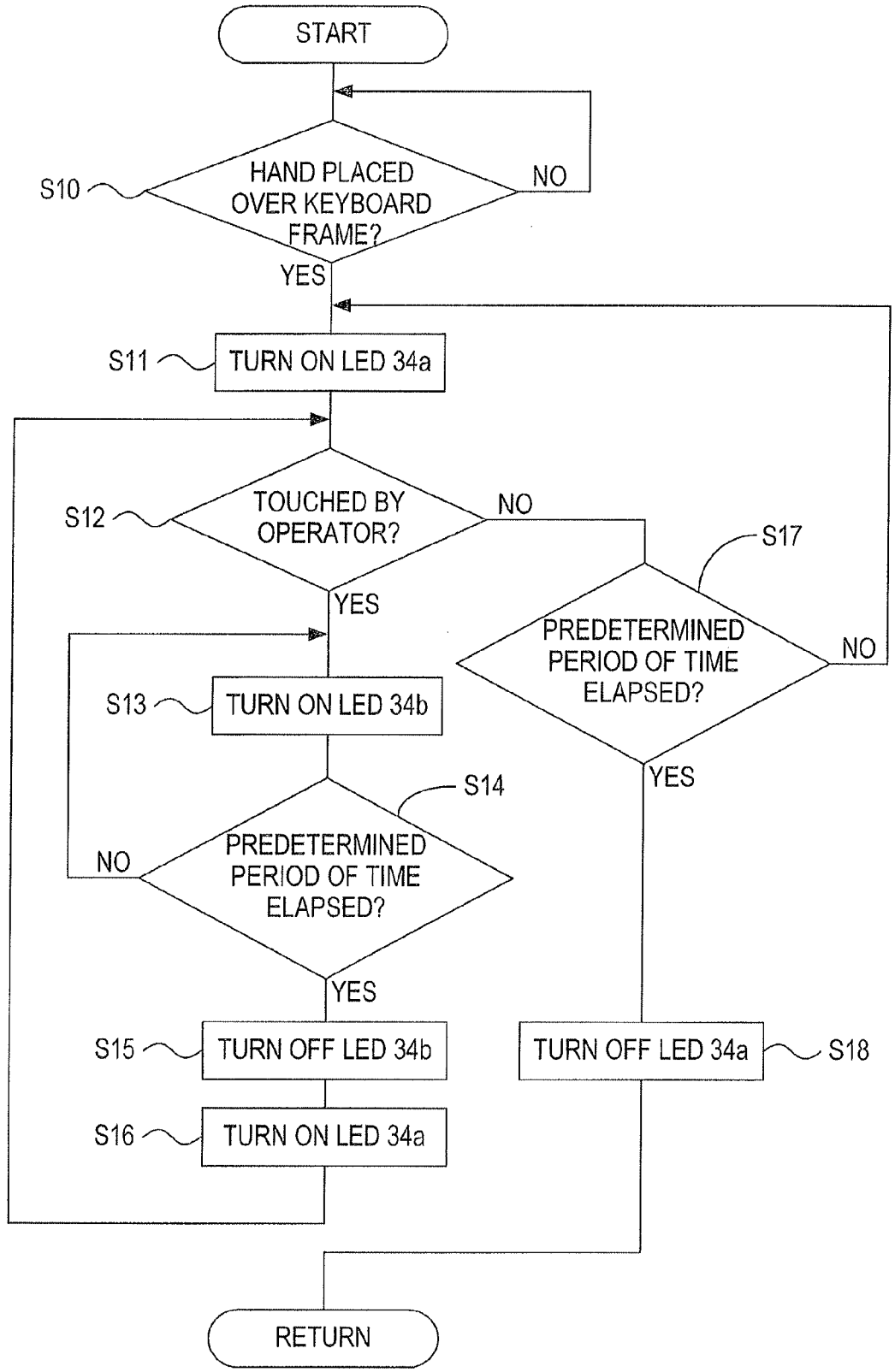
FIG. 5 is a flowchart showing a light emission control executed by a controller of the embodiment.
Figure 6:
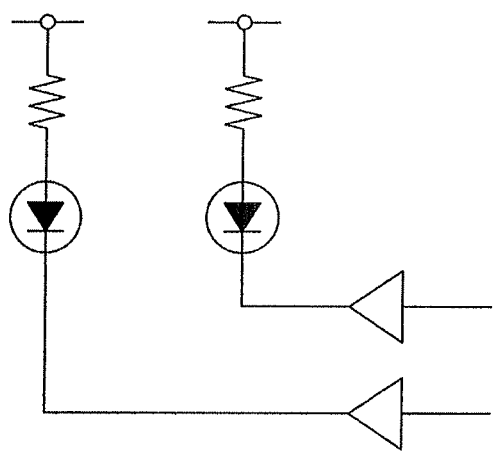
FIG. 6 is a circuit diagram of a light emission control circuit according to a related art.

As illustrated in FIG. 5, once the light emission control is initiated, the process proceeds to S10 at which the controller 7 determines the presence or the absence of the operator's hand over the keyboard frame 3.

When the operator's hand is placed somewhere two centimeters above the keyboard frame 3, the touch sensor 32 of any one of the switches 30 transmits, to the controller 7, a first signal indicating the presence of the operator's hand. Accordingly, the determination at S10 follows whether the first signal is inputted to the controller 7 by the touch sensor 32 of the subject switch 30.

When it is determined that the operator's hand is not positioned over the keyboard frame 3 (S10:NO), the process at S10 is executed again. When it is determined that the operator's hand is positioned over the keyboard frame 3 (S10: YES), the process proceeds to S11 to turn on the LED 34a.

More specifically, at S11, the controller 7 performs a process to set the logical value of the input signal inputted to the first input terminal 52b of the three-state buffer 52 to "Low" and also to set the logical value of the control signal inputted to the second input terminal 52c to "Low". According to this process, the voltage of the output terminal 52a of the three-state buffer 52 is set to the voltage at the ground point, only the LED 34a is turned on by the voltage enabling only one of the pair of LEDs 34a and 34b to turn on. The switch 30 then turns on yellow. At S11, the aforementioned process is applied to all the switches 30 to turn on all the LEDs 34a The process proceeds to S12 at which the controller 7 determines whether the operator's finger has touched the smoked acrylic 35 of any one of the switches 30. When the operator's finger has touched the smoked acrylic 35 of any one of the switches 30, the touch sensor 32 of the touched switch 30 transmits, to the controller 7, a second signal indicating the touch of the operator's finger. Accordingly, the determination at S12 follows whether the second signal is inputted to the controller 7 by the touch sensor 32 of the subject switch 30.

When it is determined that the operator's finger has not touched the smoked acrylic 35 of any one of the switches 30 (S12:NO), the process proceeds to S17 described below. When it is determined that the operator's finger has touched any one of the switches 30 (S12:YES), the process proceeds to S13 to turn on the LED 34b of the touched switch 30.

More specifically, at S13, the controller 7 performs a process to set the logical value of the first input terminal 52b of the three-state buffer 52 for the switch 30, from which the second signal has been transmitted, to "High" and also to set the logical value of the control signal to the second input terminal 52c to "High".

According to the above-described process, the voltage of the output terminal 52a of the three-state buffer 52 for the touched switch 30 is set to the voltage at the voltage applied point, thereby no difference occurs in voltages between the anode and cathode of the LED 34a and turning off the LED 34a. Meanwhile, the anode of the LED 34b for the touched switch 30 is applied with the voltage at the voltage applied point, thereby turning on only the LED 34b. As a result, the switch 30 touched by the operator's finger turns on red.

After the turning on of the LED 34b at S13, the process proceeds to S14 at which the controller 7 determines whether a first predetermined period of time (0.5 second according to the embodiment) has elapsed since the turning on of the LED 34b.

When the controller 7 determines that the first predetermined period of time has not elapsed (S14: NO), the processes at S13 and S14 are repeatedly executed so as to keep the LED 34b turned on. Meanwhile, when the controller 7 determines that the first predetermined period of time has elapsed (S14: YES), the LED 34b is turned off (S15). Then, the LED 34a of the switch 30 with the LED 34b switched from the on-state to the off-state immediately before is turned on (S16). After the process at S16, the process at S12 is executed again. At S16, the controller 7 performs a process to set the logical value of the first input terminal 52b of the three-state buffer 52 for the touched switch 30 to "Low" and also to set the logical value of the control signal to the second input terminal 52c to "High".

When it is determined that the operator's finger has not touched the smoked acrylic 35 of any one of the switches 30 at S12 (S12:NO), the process at S17 is executed. At S17, the controller 7 determines whether a second predetermined period of time has elapsed since the last touch on any one of the switches 30 or since the LED 34a was turned on at S11 without the touch on the switches 30.

When the controller 7 determines that the second predetermined period of time has elapsed, a process to turn off the LED 34a is executed (S18).

More specifically, at S18, the controller 7 performs a process to set the logical value of the control signal to the second input terminal 52c of the three-state buffer 52 to "High" and to set the output terminal 52a of the three-state buffer 52 to the high impedance state.

Accordingly, the voltage of the output terminal 52a of the three-state buffer 52 is set to the above-mentioned connecting point voltage, so that the LED 34a is turned off without turning on the LED 34b.

When the process at S18 is completed, the processes at S10 and after are repeated again.

[Functions and Effects of the Embodiment]

According to the keyboard instrument 1 described above, when the operator's hand is placed over the keyboard frame 3, the LEDs 34a of all the switches 30 embedded in the keyboard frame 3 are turned on, thereby enabling to indicate clearly the positions of the respective switches 30.

In this case, the respective switches 30 turn on yellow, and the patterns, which are respectively allocated to the switches 30 and represent input letters, and the frames surrounding the patterns appears clearly on the keyboard frame 3.

When any one of the switches 30 is touched, the color of the pattern and frame of the switch 30 changes to red. Therefore, it is apparent which switch 30 has been operated.

When time passes since the detection of the operator's hand over the keyboard frame 3 or the last touch on the switch 30, the LEDs 34a, 34b are turned off. Further, as mentioned above, the smoked acrylic 35 forming each of the switches 30 is colored in the same color as the surface of the keyboard frame 3. Accordingly, the switches 30 become less noticeable on the keyboard frame 3, resulting in keeping the entire keyboard instrument beautiful.

According to the keyboard instrument 1 of the embodiment, when each of the switches 30 turns on, the pattern of each of the switches 30 turns on with an even brightness, thereby enabling to exhibit each of the switches 30 beautifully.

Further, when the patterns of the switches 30 are displayed, the frames surrounding the respective patterns are displayed and indicate the positions of the respective corresponding switches 30. Therefore, the operator can operate the switches 30 appropriately as intended, with reference to the frames.

According to the embodiment, the LEDs 34a, 34b correspond to an example of a light emitting unit, a first light source, and a second light source of the present invention, the controller 7 corresponds to an example of a control unit of the present invention, the smoked acrylic 35 corresponds to an example of a translucent plate of the present invention, the three-state buffer 52 corresponds to an example of a control element of the present invention, and the power conversion device 50 corresponds to an example of a voltage applying unit of the present invention.

The present invention should not be construed as limited to the embodiments set forth above and can be achieved in any modes within the scope of the present invention.

What is claimed is:
1. A switch comprising:
a substrate;
a touch sensor mounted on the substrate and configured to detect an operator's touch operation relative to the switch;
a light guide plate stacked on the touch sensor and having a chamfered surrounding side surface so that light entering into the chamfered surrounding side surface of the light guide plate diffusely reflects inside the light guide plate;
a light emitting unit mounted on the substrate and arranged at a position facing the chamfered surrounding side surface of the light guide plate, the light emitting unit being configured to emit the light to the chamfered surrounding side surface of the light guide plate; and
a control unit configured to control a light emission of the light emitting unit in accordance with a detection result of the touch sensor for detecting the operator's touch operation.

2. The switch according to claim 1, wherein the chamfered surrounding side surface of the light guide plate is cut linearly and at a slant so that an edge of a first surface of the light guide plate is located inside of an edge of a second surface of the light guide plate, the second surface being opposite to the first surface, and the first surface and the second surface of the light guide plate are arranged coaxially.

3. The switch according to claim 1, wherein the light guide plate includes a carved portion formed by carving a part of the light guide plate to form a pattern.

4. The switch according to claim 1 further comprising:
a translucent plate located at a position facing a surface of the light guide plate in coplanar with a surface of a casing provided with the switch.

5. The switch according to claim 4 further comprising:
a sheet layered at a side of the translucent plate facing the light guide plate and covering a portion excluding a portion facing the light guide plate.

6. The switch according to claim 4, wherein the touch sensor is:
a sensor configured to perform a first detection and a second detection, the first detection serves to detect an operator's hand placed over the touch sensor at a predetermined distant position from the touch sensor where the operator does not touch the translucent plate, and the second detection serves to detect the operator's touch on the translucent plate, and
wherein the control unit is configured to allow the light emitting unit to perform a first light emission when the touch sensor performs the first detection and to allow the light emitting unit to perform a second light emission when the touch sensor performs the second detection.

7. The switch according to claim 1, wherein the light emitting unit is configured to emit lights having a plurality of different colors, and the control unit is configured to control the light emitting unit to emit the light having any one of the plurality of different colors in accordance with the detection result.

8. The switch according to claim 1, wherein the control unit is configured to stop the light emission of the light emitting unit when a predetermined period of time has elapsed since the touch sensor does not detect the touch operation.

9. The switch according to claim 1, wherein the light emitting unit comprises a first light source and a second light source connected in series each other between a predetermined voltage applied point and a predetermined ground point, and the switch further comprising:
a voltage applying unit configured to apply a driving voltage enabling one of the first light source and the second light source to turn on between the voltage applied point and the ground point; and
a control element having an output terminal connected between the first light source and the second light source, connected to the control unit, and configured to operate by the driving voltage,
wherein the control unit is configured to control the control element, and the control element is configured to switch a voltage of the output terminal among the driving voltage, a ground voltage being a voltage at the ground point, and a voltage lower than the driving voltage and higher than the ground voltage.

10. A keyboard instrument comprising a switch, and the switch comprising:
a substrate;
a touch sensor mounted on the substrate and configured to detect an operator's touch operation relative to the switch;
a light guide plate stacked on the touch sensor and having a chamfered surrounding side surface, so that light entering into the chamfered surrounding side surface of the light guide plate diffusely reflects inside the light guide plate;
a light emitting unit mounted on the substrate and arranged at a position facing the chamfered surrounding side surface of the light guide plate, the light emitting unit being configured to emit the light to the chamfered surrounding side surface of the light guide plate; and
a control unit configured to control a light emission of the light emitting unit in accordance with a detection result of the touch sensor for detecting the operator's touch operation.

11. A light emission control circuit comprising:
a first light source and a second light source connected in series each other between a predetermined voltage applied point and a predetermined ground point;
a voltage applying circuit configured to apply a driving voltage enabling one of the first light source and the second light source to turn on between the voltage applied point and the ground point;

a control element having an output terminal connected between the first light source and the second light source and configured to operate by the driving voltage; and a control circuit configured to control the control element;

wherein the control element is configured to switch a voltage of the output terminal among the driving voltage, a ground voltage being a voltage at the ground point, and a voltage lower than the driving voltage and higher than the ground voltage.

12. The light emission control circuit according to claim 11, wherein the first light source and the second light source are connected to adjusting resistors that adjust voltages applied to the first light source and the second light source.

13. The light emission control circuit according to claim 11, wherein the control element is a three-state buffer.

14. The light emission control circuit according to claim 11, wherein the first light source and the second light source are configured to emit lights having colors different from each other.

* * * * *